United States Patent
Nelson et al.

(10) Patent No.: US 8,767,444 B2
(45) Date of Patent: Jul. 1, 2014

(54) RADIATION-HARDENED MEMORY ELEMENT WITH MULTIPLE DELAY ELEMENTS

(75) Inventors: David Nelson, Medicine Lake, MN (US); Keith Golke, Minneapolis, MN (US); Harry H L Liu, Maple Grove, MN (US); Michael Liu, Bloomington, MN (US)

(73) Assignee: Honeywell International Inc., Morristown, NJ (US)

( * ) Notice: Subject to any disclaimer, the term of this patent is extended or adjusted under 35 U.S.C. 154(b) by 285 days.

(21) Appl. No.: 11/389,767

(22) Filed: Mar. 27, 2006

(65) Prior Publication Data

US 2007/0242537 A1  Oct. 18, 2007

(51) Int. Cl.
| | | |
|---|---|---|
| *G11C 11/41* | (2006.01) | |
| *G11C 11/412* | (2006.01) | |
| *G11C 11/413* | (2006.01) | |
| *G11C 11/417* | (2006.01) | |
| *G11C 7/02* | (2006.01) | |
| *G11C 7/24* | (2006.01) | |
| *G11C 5/02* | (2006.01) | |
| *G11C 5/06* | (2006.01) | |

(52) U.S. Cl.
USPC ........... 365/154; 365/194; 365/195; 365/156; 365/206

(58) Field of Classification Search
USPC ............... 365/154, 194, 196, 185.02, 185.09, 365/195, 206, 156
See application file for complete search history.

(56) References Cited

U.S. PATENT DOCUMENTS

| | | | | |
|---|---|---|---|---|
| 5,325,338 | A * | 6/1994 | Runaldue et al. | 365/230.05 |
| 6,058,041 | A * | 5/2000 | Golke et al. | 365/156 |
| 7,193,451 | B2 * | 3/2007 | Hendrickson | 327/199 |
| 7,200,031 | B2 * | 4/2007 | Liu et al. | 365/154 |
| 2003/0185044 | A1 * | 10/2003 | Nii | 365/154 |
| 2006/0056220 | A1 | 3/2006 | Roche et al. | |

FOREIGN PATENT DOCUMENTS

WO  WO 00/39857  7/2000  ............. H01L 27/12

OTHER PUBLICATIONS

Nelson et al., "150nm SOI Embedded SRAMs with Very Low SER," Honeywell DSES Plymouth, MN 55441, Oct. 3-6, 2005, p. 188-190.
International Search Report for PCT/US2006/048489 dated Aug. 6, 2007.
Liu H Y et al., "Proton Induced Single Event Upset in a 4M SOI SRAM", 2003 IEEE International SOI Conference Proceedings. Newport Beach, CA, Sep. 29-Oct. 2, 2003, IEEE International SOI Conference, New York, NY: IEEE, US Sep. 29, 2003, pp. 26-27, XP010665919.
Examination Report from corresponding EP Application No. 06845850, mailed Dec. 29, 2009, 3 pages.

* cited by examiner

*Primary Examiner* — J. H. Hur
(74) *Attorney, Agent, or Firm* — Shumaker & Sieffert, P.A.

(57) ABSTRACT

A radiation hardened memory element includes at least two delay elements for maintaining radiation hardness. In an example, the memory element is an SRAM cell. Both delays are coupled together in series so that if either one of the delays fails, a delay will still be maintained within the SRAM cell. The critical areas of the delays may be positioned so that a common line of sight cannot be made between each delay and a circuit node.

7 Claims, 5 Drawing Sheets

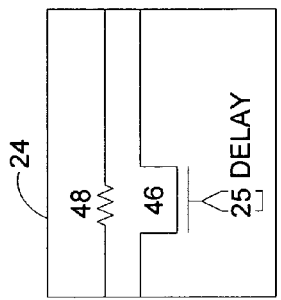
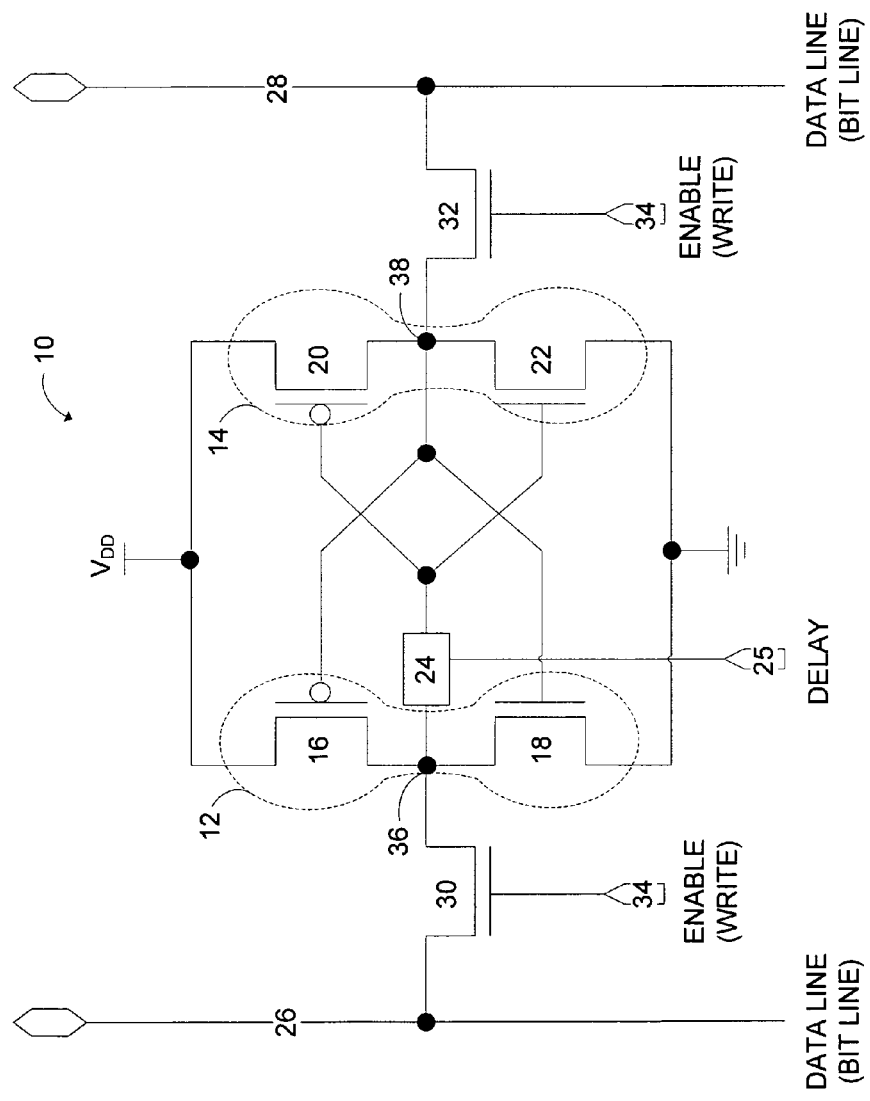
Fig. 1B
Prior Art
Fig. 1A
Prior Art

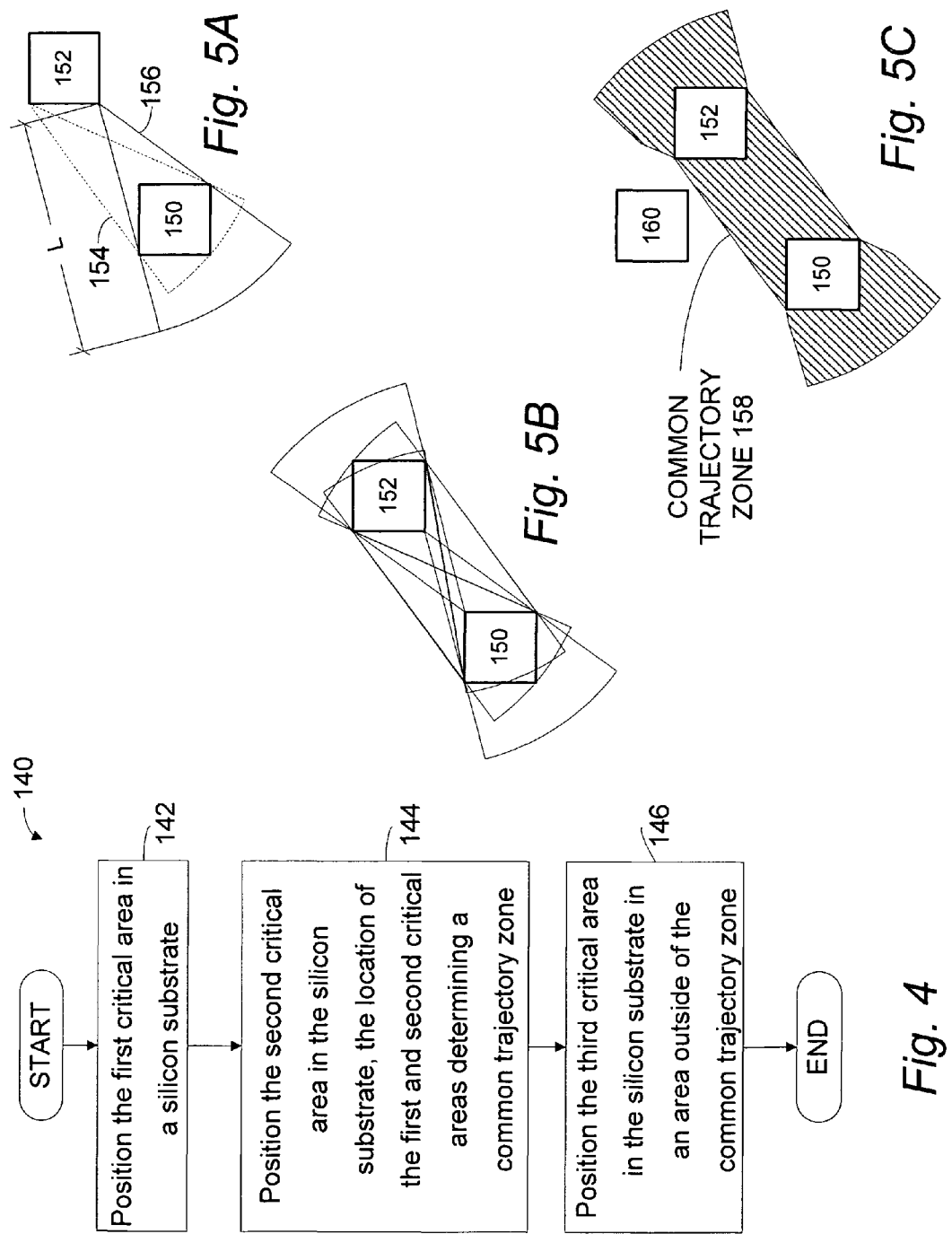

RADIATION-HARDENED MEMORY ELEMENT WITH MULTIPLE DELAY ELEMENTS

The United States Government has acquired certain rights in this invention pursuant to Contract No. DTRA01-03-D-0018 and Delivery No. DTRA01-03-D-0018-0001 awarded by the Defense Threat Reduction Agency.

FIELD

The present invention relates generally to the field of integrated circuit storage elements and more particularly a radiation hardened storage element.

BACKGROUND

Static Random Access Memory (SRAM) is often used in the cache of a CPU and in digital processing circuits where speed is an important requirement. In contrast to Dynamic Random Access Memory (DRAM), SRAM does not need to be periodically refreshed.

An SRAM includes arrays of individual SRAM cells. Each SRAM cell is addressed and accessed so that it may be "read" from or "written" to. Each SRAM cell includes a pair of cross-coupled inverters that are each used to store either a "high" or "low" voltage level. The cross-coupled inverters are coupled with a pass gate, such as a transistor to bit lines, that allows the cross-coupled inverters to be read from or written to. Unfortunately, in radiation environments, such as space and aerospace, the data state held by these cross-coupled inverters and other transistors are susceptible to upset from radiation events.

Because SRAM cells are made from semiconductor materials, such as silicon, a radiation event, such as a particle strike, may induce charge. This charge, or glitch, if large enough, may cause a node within the cross-coupled inverters to change state. If the state change results in a bit-flip or a change in state of the SRAM cell, it is referred to as a Single Event Upset (SEU) or a soft error.

One method that circuit and system designers use to prevent radiation events from causing an SEU in an SRAM is to introduce a delay element in the feedback loop between the two cross coupled inverters of an SRAM cell. For example, one SRAM cell 10, in a six transistor configuration, is illustrated in FIG. 1. SRAM cell 10 includes inverter 12 cross-coupled with inverter 14. Inverter 12 includes Field Effect Transistor (FET) 16 coupled with FET 18. Inverter 14 includes FET 20 coupled with FET 22. The coupled drains of FETs 16 and 18 are coupled to a delay 24. The delay 24 is coupled to the gates of FETs 20 and 22 and it is enabled and disabled by respective delay and bypass signals communicated at delay input 25.

The SRAM cell 10, in operation, is written to and read from by data (bit) lines 26 and 28, FETs 30 and 32 (pass gates), and enable (write) input 34. When SRAM cell 10 is to be read, an enable signal is communicated to enable input 34 and it is used to open a conduction path between the drain and source terminals of FETs 30 and 32. The voltage stored by the cross-coupled inverters at nodes 36 and 38 is then communicated respectively to data lines 26 and 28. The voltages on data lines 26 and 28 are data signals, where the data signal on signal line 28 is an inverse of the data signal on signal line 26. Throughout the read, active delay 24 is enabled.

When the SRAM cell 10 is to be written to, the enable signal is communicated to enable input 34 and active delay 24 is disabled. Output drivers, also coupled to bit lines 26 and 28, are used to drive the voltages at nodes 36 and 38. For example, if the voltage at node 36 is "low" and a "high" value is to be written, a "low" voltage is communicated by the output driver to node 38. The "low" voltage at node 38 is used to drive the gates of FETs 16 and 18 so as to set the voltage at node 36 "high". After the SRAM cell 10 is written, a disable signal may be communicated to disable input 34 and the SRAM cell 10 will store the voltage at nodes 36 and 38 until a write operation is performed again. Throughout the write, active delay 24 is disabled.

Without delay 24, the SRAM cell 10 would be more vulnerable to radiation events, including particle strikes. For example, if a state change occurs on one of the nodes within SRAM cell 10, it could propagate through the SRAM cell 10. The delay 24, however, prevents an SEU by delaying the state change from propagating around the feedback element until the charge deposited from the SEU is dissipated.

An example of SEU prevention is demonstrated as follows. If the voltage at node 38 is "low", for example, an SEU induced state change may cause the voltage at node 38 to go "high". This "high" voltage will drive node 36 "low". Delay 24, however, will continue to hold the gates of FETs 20 and 22 "high" so that node 38 returns "low". Delay 24 effectively delays the switching, or response time, of the cross-coupled inverters. If the response time is greater than the time it takes for the radiation induced charge to dissipate (i.e., the recovery time), the SRAM cell 10 has been effectively radiation hardened. When the delay signal is communicated to input 25, the delay is enabled and the response time of cross-coupled inverters 12 and 14 is increased. Alternatively, when a bypass signal is communicated to input 25, the response time is decreased. The bypass signal is generally used to decrease the delay of the SRAM cell 10 when it is being written to. The delay and bypass signals are used to optimize both the write speed and radiation hardness of the SRAM cell.

Active delay 24 generally includes elements that are used to increase or decrease the delay time of the cross-coupled inverters 12 and 14. For example, as shown in FIG. 1B, active delay 24 may include a FET 46 coupled with a resistance, such as a resistor 48. The FET 46 and resistor 48 may be coupled to receive the delay and bypass signals. When a bypass signal is communicated, the voltage at node 36 may be propagated through FET 46 (bypass path) to the gates of FETs 20 and 22. If a delay signal is communicated, however, FET 46 may close and the voltage at node 36 will be delayed for a finite amount of time by resistor 48 (delay path). The response time of the SRAM cell 10 may be tailored by adding additional elements to the delay or bypass paths of the active delay 24.

Despite the effectiveness of current active delay schemes in current SRAM cells, an SRAM cell may be vulnerable to radiation events that affect multiple nodes within the SRAM cell. For example a proton strike may induce a multiple node state change in an SRAM cell. A proton strike may cause interactions with silicon nuclei that result in an effect known as heavy ion recoil. This heavy ion recoil can travel through multiple nodes within the SRAM cell. Therefore, it would be desirable to design an SRAM cell, or other memory element, that is optimized to prevent single event and soft error phenomena from multiple node state change events.

SUMMARY

A radiation hardened memory element is presented. In one embodiment, the memory element is a Static Random Access Memory (SRAM) cell with dual active delays. Both active delays are coupled together in series. A circuit node, having a critical area that is vulnerable to a state change from a radiation event, is coupled to the dual active delays. If either one of the active delays becomes disabled, the remaining enabled active delay will maintain the radiation hardness of the SRAM cell.

The critical areas associated with the circuit node and the first and second active delays may be positioned so that a particle trajectory does not have a line of sight with all three critical areas. Two out of the three critical areas may be positioned so as to form a common trajectory zone. The remaining critical area is positioned outside of the common trajectory zone.

The dual active delays may prevent soft errors or Single Event Upsets (SEUs) associated with multiple node state change events. Such multiple node events include proton induced heavy ion recoil as well as other state change events associated with radiation environments.

These as well as other aspects and advantages will become apparent to those of ordinary skill in the art by reading the following detailed description, with reference where appropriate to the accompanying drawings. Further, it is understood that this summary is merely an example and is not intended to limit the scope of the claims.

BRIEF DESCRIPTION OF THE DRAWINGS

Certain examples are described below in conjunction with the appended drawing figures, wherein like reference numerals refer to like elements in the various figures, and wherein:

FIG. 1A is schematic diagram of a Static Random Access Memory Cell (SRAM) cell;

FIG. 1B is a schematic diagram of an active delay;

FIG. 4 is a flow diagram illustrating a method of positioning critical areas;

FIG. 5A is a block diagram of two trajectory zone calculated from two critical areas;

FIG. 5B is a block diagram illustrating multiple overlapping trajectory zones;

FIG. 5C is a block diagram illustrating placement of a critical area outside of a common trajectory zone.

DETAILED DESCRIPTION

A radiation hardened (rad-hard) Static Random Access Memory (SRAM) cell is presented. The SRAM cell is formed in a silicon substrate which may be subjected to a variety of radiation environments. To make the SRAM cell rad-hard, two active delay elements are placed within the SRAM cell so that radiation events, including multiple node state changes, are mitigated. Such multiple node state changes may result from particles (e.g., a heavy ion) traveling in parallel with a common device plane that components of the SRAM cell reside in.

In general, radiation environments contain a variety of neutral and charged particles. Two such types of charged particles are protons and heavy ions. Heavy ions have a larger mass than protons and thus interact with silicon atoms in a silicon substrate in a different manner. Heavy ions deposit energy in silicon directly and cause changes in the state of circuit nodes if they deposit a charge greater than a charge threshold. Protons, on the other hand, interact with silicon nuclei, creating showers of secondary particles such as light fragments. Additionally, protons also create recoiling heavy ions. It has recently been shown that these recoiling heavy ions are capable of depositing charge which may also upset a circuit node (see H. Y. Liu, et al, "Proton Induce Single Event Upset in 4M SOI SRAM," *IEEE Int. SOI Conference Proceedings*, pp. 26-27, 2003 which is entirely incorporated by reference herein, as if fully set forth in this description.)

A circuit node may change state when a particle, such as a heavy ion, deposits a charge that is above a charge threshold for maintaining the storage state. Once the deposited charge exceeds the charge threshold, the node changes state leading to an upset of an SRAM cell. Many types of circuit elements such as capacitors and Field Effect Transistor (FETs) contain critical areas that may be susceptible to such a state change. For example, a heavy ion may cause a capacitor to store an incorrect charge. Alternatively, the heavy ion may cause a FET to inadvertently conduct.

Figure 2C:
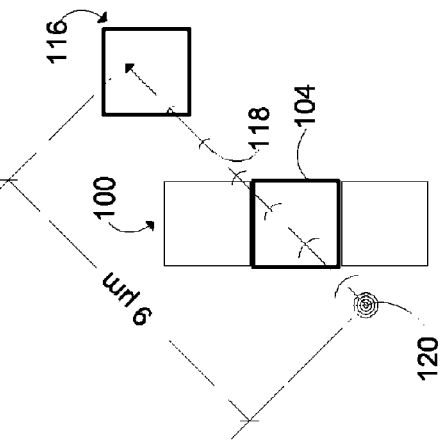
FIG. 2C is a block diagram of a proton induced heavy ion recoil traveling through two critical FET areas.
Figure 2A:
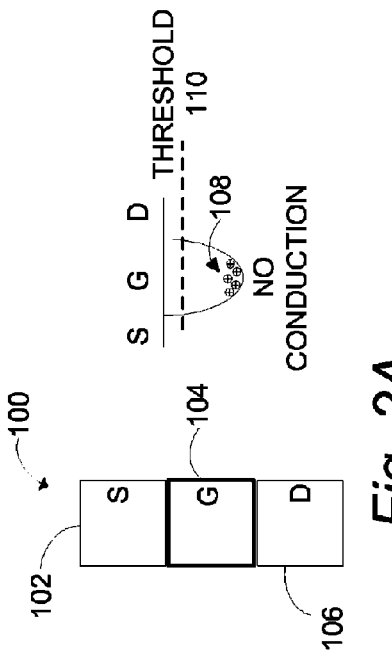
FIG. 2A shows a block diagram and a charge diagram related to a Field Effect Transistor (FET)

In FIG. 2A a top view and a charge diagram of one such FET is illustrated. FET 100 includes a source 102, a gate 104, and a drain 106. The area under the gate 104 may be a critical area. During operation, the gate 104 may be biased so that it is not-conducting. A minimal amount of charge 108 may be present below the gate 104. The amount of charge present is below threshold 110, therefore a conduction path between the source 102 and drain 106 is closed off.

Figure 2B:
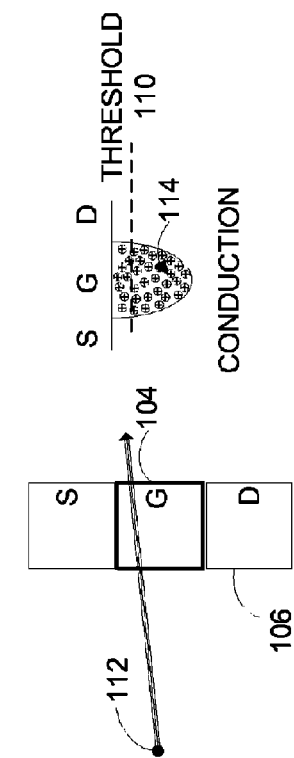
FIG. 2B shows another block diagram and charge diagram related to the FET of FIG. 2A.

In FIG. 2B, a heavy ion 112 deposits charge below the gate 104. A charge 114 that is above threshold 110 creates a conduction path between the source 102 and drain 106. The amount of deposited charge required to change the state of a FET is dependent on device parameters. One parameter, for example, is a FET's size (i.e., width and length). The smaller the FET, the less charge required to change its state.

As describe above, a single active delay is effective in reducing the probability of an SEU by delaying the signal so that the SRAM cell may recover when state changes erroneously occur. Moreover, only one active delay has been generally necessitated as the probability of both an active delay and a circuit node both being affected by a particle strike at the same time (and in close proximity) has been low until now.

Despite the historical low probability of a particle striking two proximal nodes at the same time, device scaling increases the probability of such an event occurring. This is particularly detrimental when an active delay and another proximal circuit node undergo a state change. Furthermore, heavy ion recoils (induced from proton strikes) may become a more dominant mechanism of creating multiple node state changes. Heavy ion recoils, and their affects, may not have been previously considered because the average travel path associated with such an ion is on the order of about 10 μm. This distance may have been too small in larger devices (having a larger critical area separation between devices) to allow multiple node state changes to occur.

One such multiple node state change may occur in the critical area 104 and 116 illustrated in FIG. 2C. A top view of FET 100 (which contains critical area 104) and the critical area 116 are in close proximity. The critical area 116 may be the region under a gate of a FET that the active delay comprises, for example. A multiple node state change may be initiated when a heavy ion recoil 118 is generated by an incident photon 120. The heavy ion 118 has a travel path distance of 9 μm and a trajectory that allows it to travel through the critical areas of both FET 100 and the active delay. As a result, the active delay may become disabled. If the active delay is disabled, a state change of FET 100 may be able to cause an upset of an SRAM cell.

Figure 3:
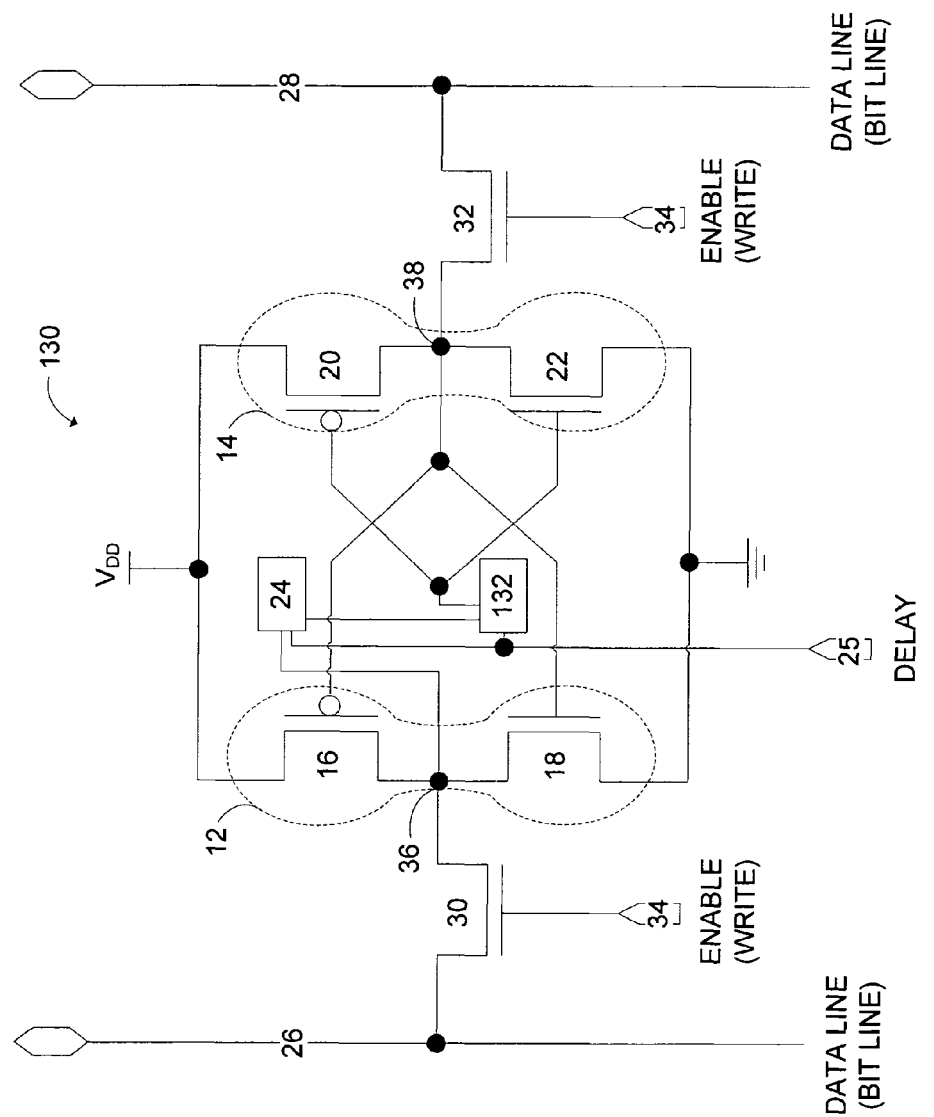
FIG. 3 is a schematic diagram of an SRAM cell having two active delays in series.

FIG. 3 shows an SRAM cell 130 that prevents multiple events from causing a soft error in an SRAM. SRAM cell 130 includes elements of SRAM cell 10, in addition, SRAM cell 130 also includes a second active delay 132 coupled in series with active delay 24. The addition of a second active delay provides a backup delay that, in operation, will remain enabled if active delay 24 is disabled by a radiation event. Furthermore, if active delay 132 is disabled, active delay 24 will retain a delay for SRAM cell 130. Active delays 24 and 132 are coupled to delay input 25 so that delay and bypass signals may be communicated to both delays. Consequently, if SRAM cell 130 is to be written, both delays can be bypassed for optimized write speeds.

The probability of a multiple node event (i.e., three or more upset nodes) in the SRAM cell 130 can be eliminated by considering the placement of the active delays. One such method is illustrated in the flow diagram of FIG. 4. At the first step shown at block 142, a first critical area of a first active delay is positioned in a first portion of a silicon substrate. At block 144, a second critical area of a second active delay is positioned in a second portion of the silicon substrate. The SRAM cell may be optimized for area minimization by placing the first active delay in close proximity to the second active delay (i.e., within the trajectory path of a heavy ion recoil). A third critical area of a FET is also positioned in the silicon substrate, as shown at block 146. The FET may also be placed in close proximity to the first and second active delays so that the area of the SRAM cell is minimized. The FET should not be placed in the line of sight of a particle that may cause multiple node state changes. This line of sight lies within a common trajectory zone. The determination of a common trajectory zone is described below.

In FIG. 5A two critical areas 150 and 152 are located in close proximity. A common trajectory zone is determined by considering the average path length, "L", associated with a particle. Using the average particle path length, a potential particle trajectory may be determined from perimeter boundaries of both critical areas 150 and 152 where the particle would only just be able to cause a state change in both of the critical areas 150 and 152. The potential particle trajectory is a common line of sight that may be viewed as a substantially straight line or it may fan out by further scattering with silicon nuclei.

Once the potential particle trajectory is determined, subareas 154 and 156 may be calculated. Trajectory zone 154 and 156 define where a particle would first cause a state change in critical area 152 and then critical area 150. A plurality of trajectory zones may be calculated, such as those shown in FIG. 5B. All these trajectory zones define where a trajectory may cause a state change in both critical areas 150 and 152. FIG. 5C shows a common trajectory zone 158, which comprises multiple trajectory zones.

Once the common trajectory zone 158 is determined, a third critical area 160, which may be associated with a FET, an active delay, or other circuit node, is positioned in the silicon substrate. If the third critical area is placed outside of the common trajectory zone 158, the probability of all three critical areas 150, 152, and 160 being affected by a particle, such as a heavy ion recoil, is eliminated.

A variety of calculations may be used to calculate a common trajectory zone. Monte Carol simulations, for example, may be able to more accurately determine the trajectory path of a particle. Integration techniques and other types of statistical modeling may be used to optimize a common trajectory zone calculation. Because the trajectory zone is dependent on the average path length of a particle, larger or smaller common trajectory zones may be calculated based on a probability, or cross-section, threshold associated with larger or smaller particle path lengths. For example, a common trajectory zone may be calculated using a particle path length that is twice the average particle path length, so that lower probability path lengths are accounted for.

Figure 6:
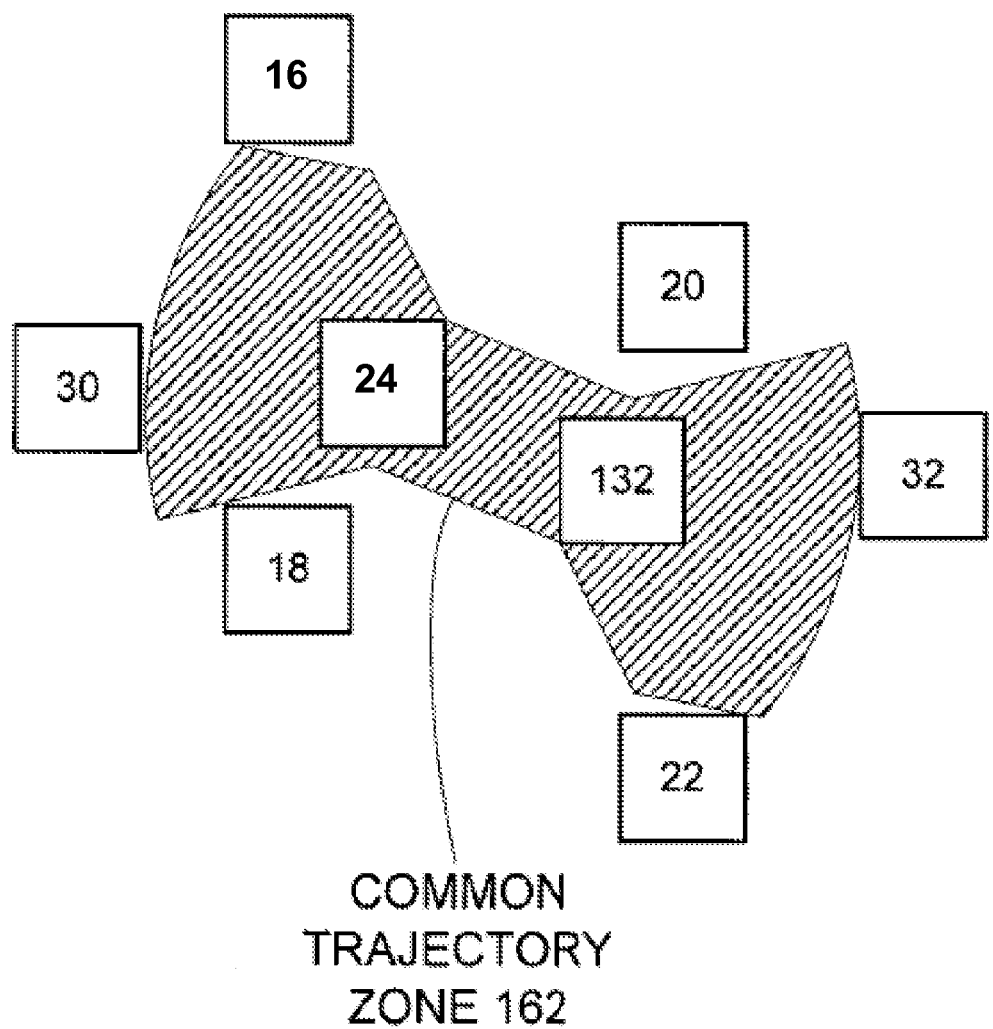
FIG. 6 is a block diagram illustrating placement of multiple critical areas outside of a common trajectory zone.

All or a selected number of devices within an SRAM cell may use a common trajectory zone calculation between two or more active delays to determine the placement of circuit nodes having critical areas. An example of a common trajectory zone between two active delays is illustrated in FIG. 6. The critical areas of FETs 16, 18, 20, 22, 30 and 32 of the SRAM cell 130 of FIG. 3 are placed outside of the common trajectory zone 162 associated with the first active delay 24 and the second active delay 132. By placing all of the critical areas outside of the common trajectory zone 162, the probability associated with a multiple state change disabling both active delays and any one of the FETs is much reduced as a common line of sight trajectory cannot be made through both active delays and any circuit element.

Overall, the above examples describe a radiation hardened SRAM cell that includes two active delays. The active delays are coupled in series so that if either active delay becomes erroneously disabled, the SRAM cell will remain protected against radiation events. Multiple node state changes, such as those that occur from a variety of particle strikes may be reduced by implementing the above dual active delay method and structure. The above examples are not limited to active delays. Other types of delay elements, such as passive delays, may also be coupled in series. In addition, the delay elements are not limited to residing exclusively in an SRAM cell. Other types of memory elements, such as a flip-flop, or a latch, for instance, may include dual delays in a similar fashion. The delay elements may also reside in a variety of feedback paths such as those associated with cross-coupled inverters, tri-state inverters, NAND gates, or a variety of other feedback elements. It should be understood that the illustrated examples are examples only and should not be taken as limiting the scope of the present invention. Note, in some instances delays may be placed in parallel instead of series and they may also be placed on either side of a feedback path. The claims should not be read as limited to the described order or elements unless stated to that effect. Therefore, all examples that come within the scope and spirit of the following claims and equivalents thereto are claimed as the invention.

We claim:

1. A method of radiation hardening a memory element having a feedback element, the method comprising:

positioning a first delay in a feedback path of the feedback element, the first delay residing in a first portion of a device plane;

positioning a second delay in the feedback path, the second delay coupled in series with the first delay and residing in a second portion of the device plane; and positioning a component of the memory element in a third portion of the device plane so that the first, second, and third portions of the device plane are positioned such that deposition of charge from an incident single particle cannot occur in all three portions, thereby reducing a probability that the particle traveling through the device plane would cause an upset of the memory element, wherein two of the first, second, and third portions of the device plane reside in a common trajectory zone defining where a trajectory of the particle may disable or cause a particle induced state change in two of the first delay, the second delay and the component of the memory element, and wherein one of the first, second, and third portions of the device plane is located outside of the common trajectory zone.

2. The method as in claim 1, wherein the first and second portions of the device plane reside in the common trajectory zone, and wherein the third portion of the device plane resides outside of the common trajectory zone.

3. The method as in claim 1, wherein the first and third portions of the device plane resides in the common trajectory zone, and wherein the second portion of the device plane reside outside of the common trajectory zone.

4. The method as in claim 1, wherein the first and second delays each have a critical area that is susceptible to a deposition of charge from the incident single particle.

5. The method as in claim 4, wherein the critical areas of the first and second delays are each associated with a field effect transistor.

6. The method as in claim 4, wherein the critical areas of the first and second delays are each associated with a diode.

7. The method as in claim 4, wherein the critical areas of the first and second delays are each associated with a capacitor.

\* \* \* \* \*